(12) United States Patent
Yoneda et al.

(10) Patent No.: US 7,454,186 B2
(45) Date of Patent: Nov. 18, 2008

(54) DIRECT CONVERSION RECEIVING APPARATUS AND CELLUAR PHONE

(75) Inventors: Takuji Yoneda, Nishinomiya (JP); Hidehiko Kurimoto, Takarazuka (JP); Kaoru Ishida, Shijonawate (JP)

(73) Assignee: Panasonic Corporation, Osaka (JP)

( * ) Notice: Subject to any disclaimer, the term of this patent is extended or adjusted under 35 U.S.C. 154(b) by 595 days.

(21) Appl. No.: 11/169,978

(22) Filed: Jun. 29, 2005

(65) Prior Publication Data

US 2006/0009182 A1 Jan. 12, 2006

(30) Foreign Application Priority Data

Jul. 5, 2004 (JP) ............................. P2004-198611

(51) Int. Cl.
*H04B 1/26* (2006.01)
(52) U.S. Cl. .................. 455/324; 455/244.1; 455/234.2
(58) Field of Classification Search .................. 455/324, 455/232.1, 234.1, 234.2, 244.1
See application file for complete search history.

(56) References Cited

U.S. PATENT DOCUMENTS 7,003,271 B2 * 2/2006 Kluge et al. ............. 455/240.1

2003/0142767 A1 7/2003 Ichihara

FOREIGN PATENT DOCUMENTS

JP 2003-224489 8/2003

* cited by examiner

*Primary Examiner*—Edward Urban
*Assistant Examiner*—Christian A Hannon
(74) *Attorney, Agent, or Firm*—RatnerPrestia (57) ABSTRACT

The direct conversion receiving apparatus has a gain control amplifier for variably amplifying a base band signal based on a gain switching control signal. A high pass filter has a first circuit including capacitors connected in parallel that are inserted in a path connecting an input terminal to an output terminal and switching effective total capacitance of the capacitors based on a first time constant switching control signal, and a second circuit including a resistor for providing a predetermined direct current voltage to the output terminal and switching the effective resistance value of the resistor based on a second time constant switching control signal. A control circuit outputs the gain switching control signal, and the first and second time constant switching control signals according to the change of the gain control of said gain control amplifier.

15 Claims, 8 Drawing Sheets

Fig.1

*Fig.3A*
RF INPUT SIGNAL

*Fig.3B*
GAIN SWITCHING

*Fig.3C*
SECOND TIME CONSTANT SWITCHING

*Fig.3D*
FIRST TIME CONSTANT SWITCHING

*Fig.3E*
HPF OUTPUT SIGNAL

RF INPUT SIGNAL

*Fig.8B* PRIOR ART

GAIN SWITCHING

*Fig.8C* PRIOR ART

SECOND TIME CONSTANT SWITCHING

*Fig.8D* PRIOR ART

HPF OUTPUT SIGNAL

DIRECT CONVERSION RECEIVING APPARATUS AND CELLUAR PHONE

BACKGROUND OF THE INVENTION

1. Field of the Invention

The present invention generally relates to a direct conversion receiving apparatus and a cellular phone, and particurally, to a wireless direct conversion receiving apparatus provided with a structure for supressing transitional DC offset variation when the gain of a gain control amplifier is switched, and a cellular phone using the same.

2. Description of the Related Art

In recent years, in a receiving apparatus for wireless communication such as a cellular phone, miniaturization and a low cost have been highly required. As a system capable of decreasing the number of parts, a direct conversion system has been known. The direct conversion system is a system to multiply a high frequency (RF) signal received by an antenna by a local oscillation signal (a local signal) of the substantially same frequency as the high frequency and directly take out a base band signal while omitting conversion into a middle frequency. By employing the direct conversion system, a monolithic IC can be realized.

However, the direct conversion system has defects, and one of them relates to a DC (direct current) offset variation. Since the DC offset variation causes deterioration of a BER (bit error rate) and decrease of a dynamic range of an A/D converter, or the like, a method to suppress the DC offset variation has been conventionally proposed.

As the simplest example of the above-described method, there is a method of inserting a high pass filter that is set at a cutoff frequency for minimizing the deterioration of the BER into a direct conversion receiving apparatus. However, only by inserting the high pass filter, a static DC offset variation can be suppressed, however, a transitional DC offset variation when the gain of a gain control amplifier is switched cannot be suppressed. Therefore, a method of suppressing the transitional DC offset variation is very important.

Figure 7:
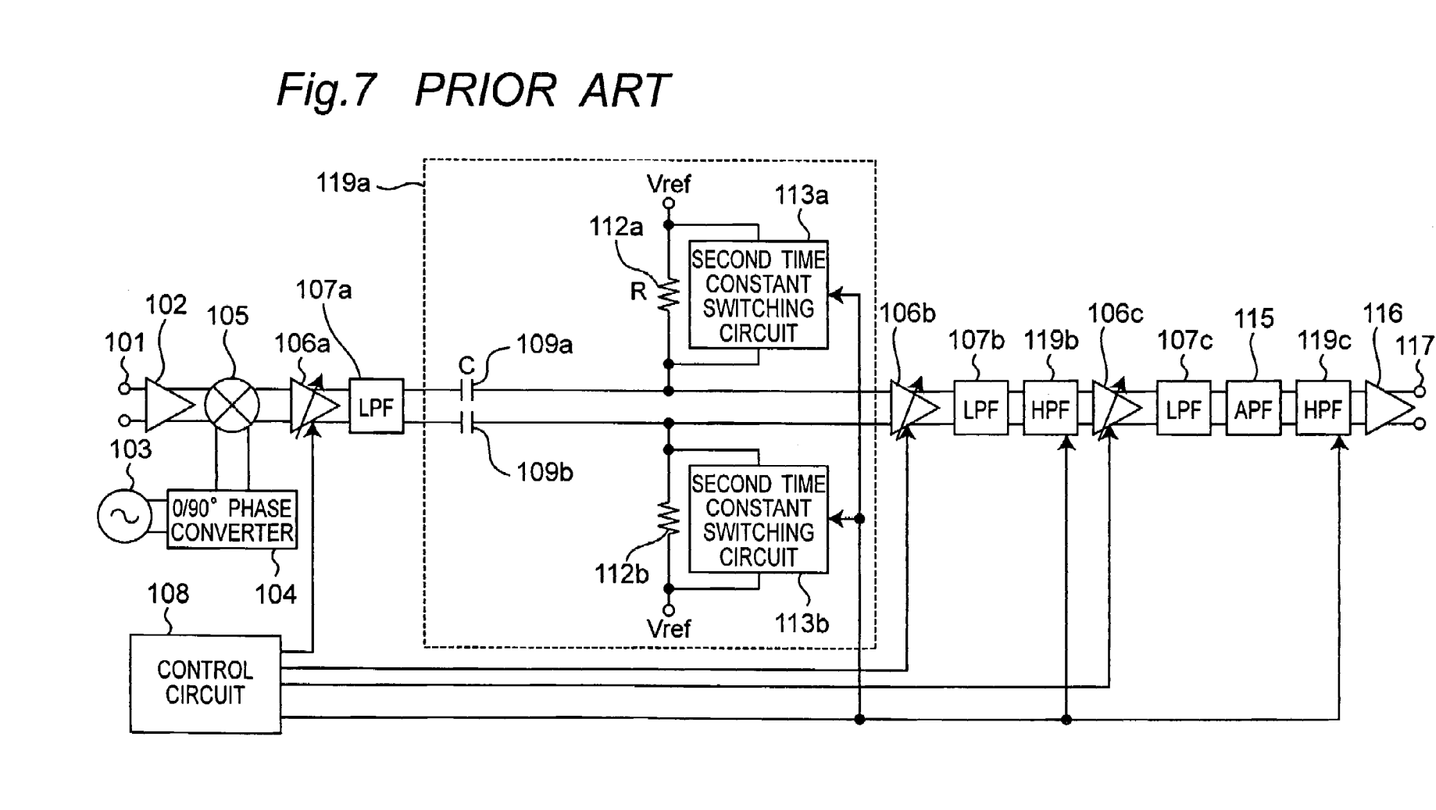
FIG. 7 is a block diagram showing the structure of a conventional direct conversion receiving apparatus.

The direct conversion receiving apparatus according to a conventional example using a method of suppressing the transitional DC offset variation is disclosed in JP-A-2003-224489. With reference to FIG. 7 and FIG. 8, the direct conversion receiving apparatus according to the conventional example will be described below. FIG. 7 shows a structure of the direct conversion receiving apparatus according to the conventional example.

The conventional direct conversion receiving apparatus includes an input terminal 101, an RF amplifier 102, a VCO (local oscillator) 103, a 0°/90° phase converter 104, a mixer 105, gain control amplifiers (GCA) 106a, 106b, 106c, low pass filters (LPF) 107a, 107b, 107c, high pass filters (HPF) 119a, 119b, 119c, a control circuit 708, an all pass filter 115, a buffer amplifier 116, and an output terminal 117.

The gain control amplifiers (GCA) 106b and 106c are configured as same as the GCA 106a, and the low pass filters (LPF) 107b and 107c are configured as same as the LPF 107a.

In the conventional wireless direct conversion receiving apparatus, the high pass filter (HPF) 119a has first capacitor 109a and 109b which are connected between low pass filter (LPF) 107a and gain control amplifiers (GCA) 106b, first resistor 112a and 112b which are connected between a reference voltage (Vref) and gain control amplifiers 106b, and second time constant switching circuits 113a and 113b which are connected to the first resistor in parallel. The high pass filters (HPF) 119b and 119c are configured as same as the high pass filter 119a.

In the conventional wireless direct conversion receiving apparatus, a RF (radio frequency) signal received in an LNA (a low noise amplifier) and a SAW filter (not illustrated) through an antenna is input in the input terminal 101 of an IC for the RF. The RF amplifier 102 amplifies the RF signal input in the input terminal 101 and outputs it.

The VCO 103 outputs a local signal of a local oscillation frequency. The 0°/90° phase converter 104 divides the frequency of the local signal into four and outputs it. The local signal having its frequency divided into four has the same frequency as the center frequency of the RF signal input in the input terminal 101.

The mixer 105 inputs the RF signal and the local signal, demodulates them in orthogonal, generates a base band signal from the RF signal, and output it.

The gain control amplifier (GCA) 106a inputs a base band signal output from the mixer 105 and, then, amplifies the base band signal with a gain decided based on the gain switching control signal of a control circuit 708 and outputs it.

The low pass filter (LPF) 107a inputs the baseband signal, cuts off the high band frequency, and outputs this signal.

The high pass filter (HPF) 119a inputs the base band signal output from the LPF 107a, cuts off the low band frequency through the second time constant switching circuit 113a controlled by the capacitor 109a for cutting DC, the resistor 112a, and the control circuit 708 and outputs it.

The signal output from the high pass filter (HPF) 119a passes through the GCA 106b, the LPF 107b, and the HPF 119b at a second stage, and the GCA 106c, the LPF 107c, and the HPF 119c at a third stage.

The control circuit 708 outputs the gain switching control signal to the gain control amplifiers (GCA) 106a, 106b, and 106c, and outputs the second time constant switching control signal to the high pass filters 119a, 119b, and 119c.

The all pass filter (APF) 115 makes the phase of the base band signal output from the LPF 107c flat to output it.

The base band signal is output from the output terminal 117 to the outside via the buffer amplifier 116.

FIG. 8 is a wave form chart explaining the operation of the conventional direct conversion receiving apparatus. While inputting the RF signal as shown in FIG. 8A, as shown by the wave from of FIG. 8B, the gain of the gain control amplifier 106a is switched from gain 1 into gain 2 at timing of a time t2.

Figure 8A:
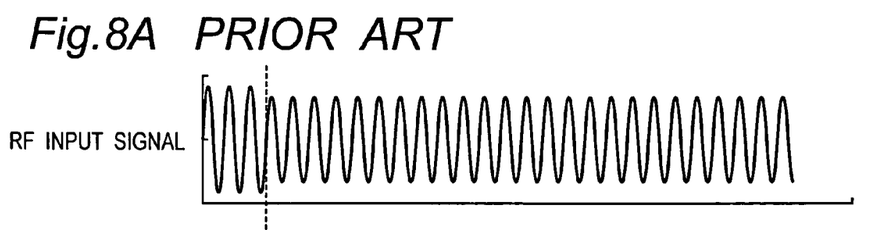
FIG. 8 is a wave form chart showing the operation of the conventional direct conversion receiving apparatus.
Figure 8B:
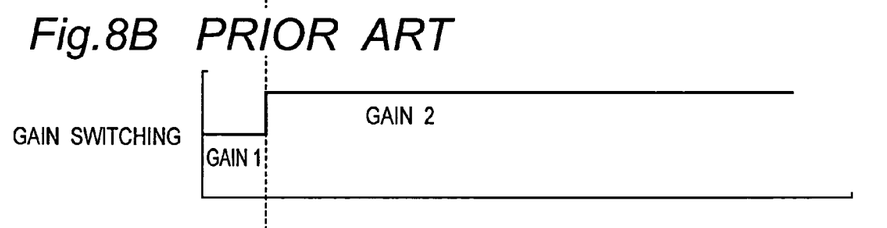
Figure 8C:
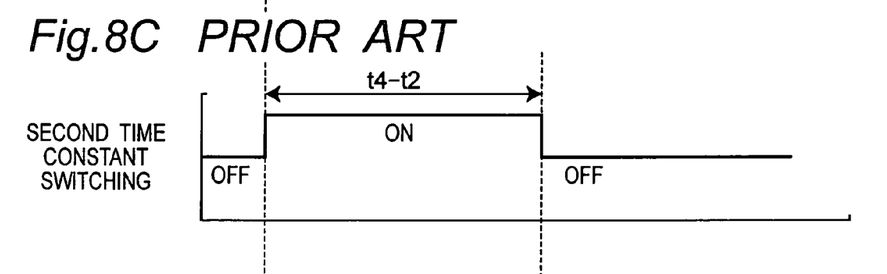

As shown in FIG. 8C, the second time constant switching circuit 113a is turned on only for a predetermined period (t2 to t4) by the control of the control circuit 708 to make the cutoff frequency of the high pass filter 119a higher (for example, about 1 MHz). Thereby, the conventional direct conversion receiving apparatus can suppress the transitional DC offset that is generated when switching the gain of the time t2.

According to the conventional direct conversion receiving apparatus, when the gain change of the GCA is sufficiently small, turning off the second time constant switching circuit 113a, the cutoff frequency of the HPF is made lower as much as possible. On the contrary, when the gain change excesses a predetermined value, the second time constant switching circuit 113a is turned on for a predetermined period to make the cutoff frequency of the HPF higher for this period, suppressing the transitional DC offset variation of the gain switching time (t2) of the GCA.

Figure 8D:
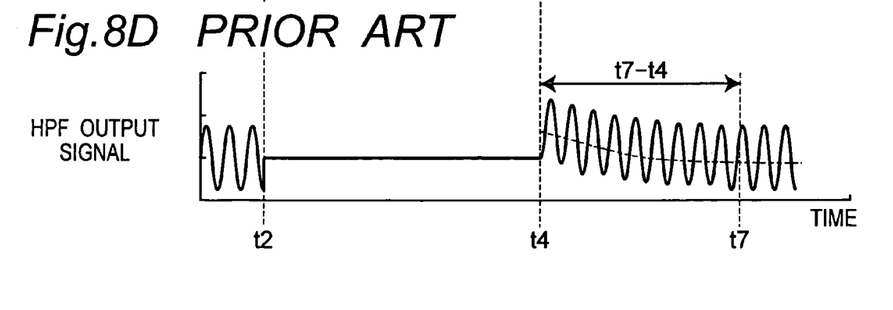

According to the conventional direct conversion receiving apparatus, at a time t4 when the second time constant switching circuits 113a and 113b are turned off from on, when the input signal into the capacitor 109 of the high pass filter 119a is located at a bottom of the wave form, for example, as shown in FIG. 8A, there is a problem such that the output signal of the high pass filter 119a generates the transitional DC offset at the time t4 as shown in FIG. 8D.

On and after the time t4, the time constant of the high pass filter 119a is set so as to prevent the wave form of the normal base band signal from being deteriorated (for example, 10 kHz), so that a period of (t4 to t7) is required in order for the transitional DC offset generated at the time t4 to converge. Since this period is very long, the BER is deteriorated. In the same way, also in the gain control amplifiers 106b and 106c at the rear stage, the transitional DC offset variation is caused when switching the gain.

SUMMARY OF THE INVENTION

The present invention has been made taking the foregoing problems into consideration and an object of the present invention is to provide a direct conversion receiving apparatus capable of suppressing the transitional DC offset variation in the output of a high pass filter generated when switching the gain of a gain control amplifier as much as possible while supressing the deterioration of a receiving signal during the normal operation by making the cutoff frequency of the high pass filter lower as much as possible, and a cellular phone using the same.

In order to solve the above-described problem, the present invention has the following structure.

A direct conversion receiving apparatus in accordance with an aspect of the present invention includes: a gain control amplifier for input a base band signal and a gain switching control signal to control a gain, and variably amplify the base band signal based on the gain switching control signal; a high pass filter having an input terminal for input the output signal of the above-mentioned gain control amplifier, an output terminal, a first circuit including plural capacitors connected in parallel that are inserted in a path connecting the input terminal to the output terminal and switching effective total capacitance of the plural capacitors based on a first time constant switching control signal, and a second circuit including a resistor for providing a predetermined direct current voltage to the output terminal and switching the effective resistance value of the resistor based on a second time constant switching control signal; and a control circuit for output the gain switching control signal, and the first and second time constant switching control signals to control the cutoff frequency of the above-mentioned high pass filter according to the change of the gain control of the above-mentioned gain control amplifier.

The direct conversion receiving apparatus according to the present invention control first and second circuits during the normal operation to make the cutoff frequency of the high pass filter lower as much as possible, and this results in the deterioration of the receiving signal being prevented as much as possible.

The direct conversion receiving apparatus according to the present invention makes the cutoff frequency of the high pass filter higher only for a predetermined period by switching a resistance value based on controlling the second circuit when switching the gain of the above-mentioned gain control amplifier. Thereby, the generation of the transitional DC offset variation in the output of the high pass filter is suppressed as much as possible.

Further, when returning the second circuit into the original state, by controlling the first circuit, the generation of the transitional DC offset variation is suppressed as much as possible.

The present invention has the operation capable of realizing a direct conversion receiving apparatus capable of suppressing generation of the transitional DC offset variation in the output of a high pass filter when switching the gain of a gain control amplifier as much as possible while suppressing the deterioration of a receiving signal during the normal operation by making the cutoff frequency of the high pass filter lower as much as possible.

The direct conversion receiving apparatus in accordance with another aspect of the present invention is further characterized in that, during the normal operation, the control circuit sets a resistance value of the second circuit at a first resistance value based on the second time constant switching control signal, and on switching the gain of the gain control amplifier, the control circuit switches the resistance value of the second circuit to a second resistance value that is smaller than the first resistance value at a first timing which is prior to a second timing at which the gain of the gain control amplifier is switched.

The direct conversion receiving apparatus according to the present invention makes the cutoff frequency of the high pass filter higher only for a predetermined period when switching the gain of a gain control amplifier by controlling as described above. Thereby, the generation of the transitional DC offset variation in the output of the high pass filter is suppressed as much as possible.

The direct conversion receiving apparatus in accordance with another aspect of the present invention is further characterized in that, during the normal operation, the control circuit sets the capacitance values of the first circuit at a first capacitance value based on the first time constant switching control signal, and sets a resistance value of the second circuit at a first resistance value based on the second time constant switching control signal; and on switching the gain of the gain control amplifier, the control circuit switches the capacitance values of the first circuit to a second capacitance value that is smaller than the first capacitance value at a third timing after a second timing at which the gain of the gain control amplifier is switched, and returns the resistance value of the second circuit to the first resistance value at a fourth timing after the third timing.

When returning the second time constant switching circuit into the original state (namely, the normal operation state), by controlling the first time constant switching circuit, the generation of the transitional DC offset variation is suppressed as much as possible.

The direct conversion receiving apparatus in accordance with another aspect of the present invention is further characterized in that the control circuit returns the capacitance values of the first circuit to the first capacitance value at a fifth timing after the fourth timing.

When returning the second time constant switching circuit into the original state (namely, the normal operation state), by controlling the first time constant switching circuit, the generation of the transitional DC offset variation is suppressed as much as possible.

The direct conversion receiving apparatus in accordance with another aspect of the present invention is further characterized in that the first circuit includes a first capacitor connecting the input terminal to the output terminal, and a serial circuit connected to the first capacitor in parallel and made of a second capacitor and a first time constant switching circuit connected to the second capacitor in series, the first time constant switching circuit being turned on/off on the basis of the first time constant switching control signal and connecting the second capacitor to the first capacitor in parallel when turned on; and the second circuit includes a first resistor providing a predetermined direct current voltage to the output terminal, and a second time constant switching circuit connected to the first resistor in parallel, the second time constant switching circuit being turned on/off on the basis of the second time constant switching control signal and causing a short-circuit in the first resistor when turned on.

The present invention has the operation capable of realizing a direct conversion receiving apparatus of a simple structure capable of suppressing generation of the transitional DC offset variation at which the gain of a gain control amplifier is switched as much as possible.

The direct conversion receiving apparatus in accordance with another aspect of the present invention is further characterized in that a value of the first capacitance is not more than 1/100 of a value of the second capacitance.

In the direct conversion receiving apparatus according to the present invention, a capacitance value is made smaller by turning off the first time constant switching circuit when returning the second time constant switching circuit from on into off (the normal operational state). The direct conversion receiving apparatus according to the present invention can suppress the generation of the transitional DC offset variation in the output signal of the high pass filter as much as possible by making the capacitance value not more than 1/100.

The direct conversion receiving apparatus in accordance with another aspect of the present invention is further characterized in that, during the normal operation, the control circuit turns off the second time constant switching circuit; and on switching the gain of the gain control amplifier, the control circuit turns on the second time constant switching circuit at a first timing prior to a second timing at which the gain of the gain control amplifier is switched.

In the case of making the first timing and the second timing the same, due to dispersion of the gain switching timing (namely, the second timing) and the switching timing of the second time constant switching circuit (namely, the first timing), there is a possibility such that the second time constant switching circuit is switched after switching of the gain. In this case, at the second timing, the DC change has a very long time constant only for a predetermined period, so that the transitional DC offset variation generated when switching the gain cannot be suppressed and this results in deterioration of the base band signal.

According to the present invention, the first timing is made into timing that is certainly faster than the second timing so as to reliably suppress the transitional DC offset variation generated when switching the gain.

The direct conversion receiving apparatus according to the present invention makes the cutoff frequency of the high pass filter higher only for a predetermined period when switching the gain of a gain control amplifier by controlling as described above. Thereby, the generation of the transitional DC offset variation in the output of the high pass filter is suppressed as much as possible.

The direct conversion receiving apparatus in accordance with another aspect of the present invention is further characterized in that, during the normal operation, the control circuit turns on the first time constant switching circuit and turns off the second time constant switching circuit; and on switching the gain of the gain control amplifier, the control circuit turns off the first time constant switching circuit at a third timing after the second timing at which the gain of the gain control amplifier is switched, and turns off the second time constant switching circuit at a fourth timing after the third timing.

In the case of making the third timing and the fourth timing the same, due to dispersion of the switching timing of the second time constant switching circuit (namely, the fourth timing) and the switching timing of the first time constant switching circuit (namely, the third timing), there is a possibility such that the first time constant switching circuit is switched after switching of the second time constant switching circuit. In this case, at the fourth timing, the DC change has a very long time constant only for a predetermined period, so that the transitional DC offset variation generated when returning the second time constant switching circuit into the normal operation state cannot be suppressed and this results in deterioration of the base band signal.

According to the present invention, the third timing is made into timing that is certainly faster than the fourth timing so as to reliably suppress the transitional DC offset variation generated when returning the second time constant switching circuit into the normal operation.

The direct conversion receiving apparatus in accordance with another aspect of the present invention is further characterized in that, the control circuit turns on the first time constant switching circuit at a fifth timing after the fourth timing.

When returning the second time constant switching circuit into the original state (namely, the normal operation state), by controlling the first time constant switching circuit, the generation of the transitional DC offset variation is suppressed as much as possible.

The direct conversion receiving apparatus in accordance with another aspect of the present invention is further characterized in that the first circuit includes a first capacitor connecting the input terminal to the output terminal, a serial circuit connected to the first capacitor in parallel and made of a second capacitor and a second resistance, and a first time constant switching circuit connected to the second resistor in parallel, the first time constant switching circuit being turned on/off on the basis of the first time constant switching control signal and causing a short circuit in the second resistor when turned on; and the second circuit includes a first resistor providing a predetermined direct current voltage to the output terminal and a second time constant switching circuit connected to the first resistor in parallel, the second time constant switching circuit being turned on/off on the basis of the second time constant switching control signal and causing a short circuit in the first resistor when turned on.

The present invention has the operation capable of realizing a direct conversion receiving apparatus of a simple structure, in which the transitional DC offset variation is hardly generated, when returning the first time constant switching circuit into the normal state.

The direct conversion receiving apparatus in accordance with another aspect of the present invention is further characterized in that two or more stages connected in series are provided, and each stage includes the gain control amplifier and the high pass filter connected at the output side of the gain control amplifier.

In the direct conversion receiving apparatus having two or more stages of the structure of the gain control amplifier and the high pass filter connected in series, particularly, the slight DC change at the first stage causes the large DC change at the rear stage so as to deteriorate the BER of the base band signal. According to the present invention, it is possible to reliably suppress the DC change at each stage.

The direct conversion receiving apparatus in accordance with another aspect of the present invention is further characterized in that the first circuit of the high pass filter in each stage is connected to the control circuit by a common control line; and the second circuit of the high pass filter in each stage is connected to the control circuit by a common control line.

According to the present invention, it is possible to make the transitional DC offset variation period of the base band signal output from the direct conversion receiving apparatus shorter as much as possible.

A cellular phone in accordance with an aspect of the present invention includes: an antenna for receiving or transmitting a radio frequency signal; a transmitting apparatus that generates a signal which is to be transmitted through the antenna; and the above-mentioned direct conversion receiving apparatus that receives the radio frequency signal through the antenna to generate a base band signal.

The present invention has the operation capable of realizing a cellular phone capable of suppressing the generation of the transitional DC offset variation in the output of the high pass filter when switching the gain of the gain control amplifier as much as possible while suppressing the deterioration of the receiving signal as much as possible during the normal operation by making the cutoff frequency of the high pass filter lower as much as possible.

The present invention has the operation capable of realizing a direct conversion receiving apparatus capable of suppressing the generation of the transitional DC offset variation in the output of the high pass filter when switching the gain of the gain control amplifier as much as possible while suppressing the deterioration of the receiving signal as much as possible up during the normal operation by making the cutoff frequency of the high pass filter lower as much as possible, and a cellular phone using this apparatus. Thereby, it is possible to realize the direct conversion receiving apparatus, in which the BER is not lowered largely even when switching the gain and the cellular phone using this apparatus.

While the novel features of the invention are set forth particularly in the appended claims, the invention, both as to organization and content, will be better understood and appreciated, along with other objects and features thereof, from the following detailed description taken in conjunction with the drawings.

It will be recognized that some or all of the figures are schematic representations for purposes of illustration and do not necessarily depict the actual relative sizes or locations of the elements shown.

DETAILED DESCRIPTION OF THE PREFERRED EMBODIMENTS

The preferred embodiments according to the present invention will be described below with reference to the accompanying drawings.

First Embodiment

Figure 1:
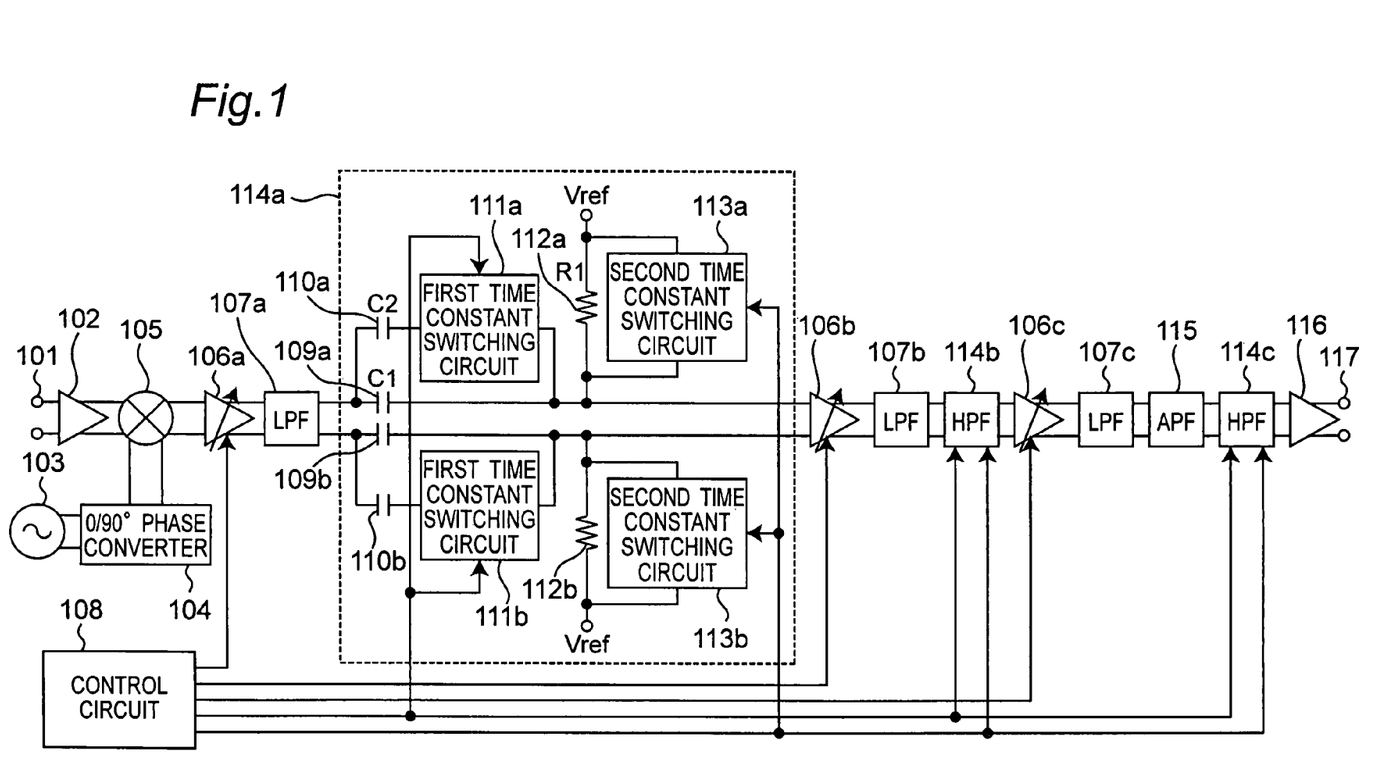
FIG. 1 is a block diagram showing the structure of a direct conversion receiving apparatus according to first and second embodiments of the present invention.
Figure 2:
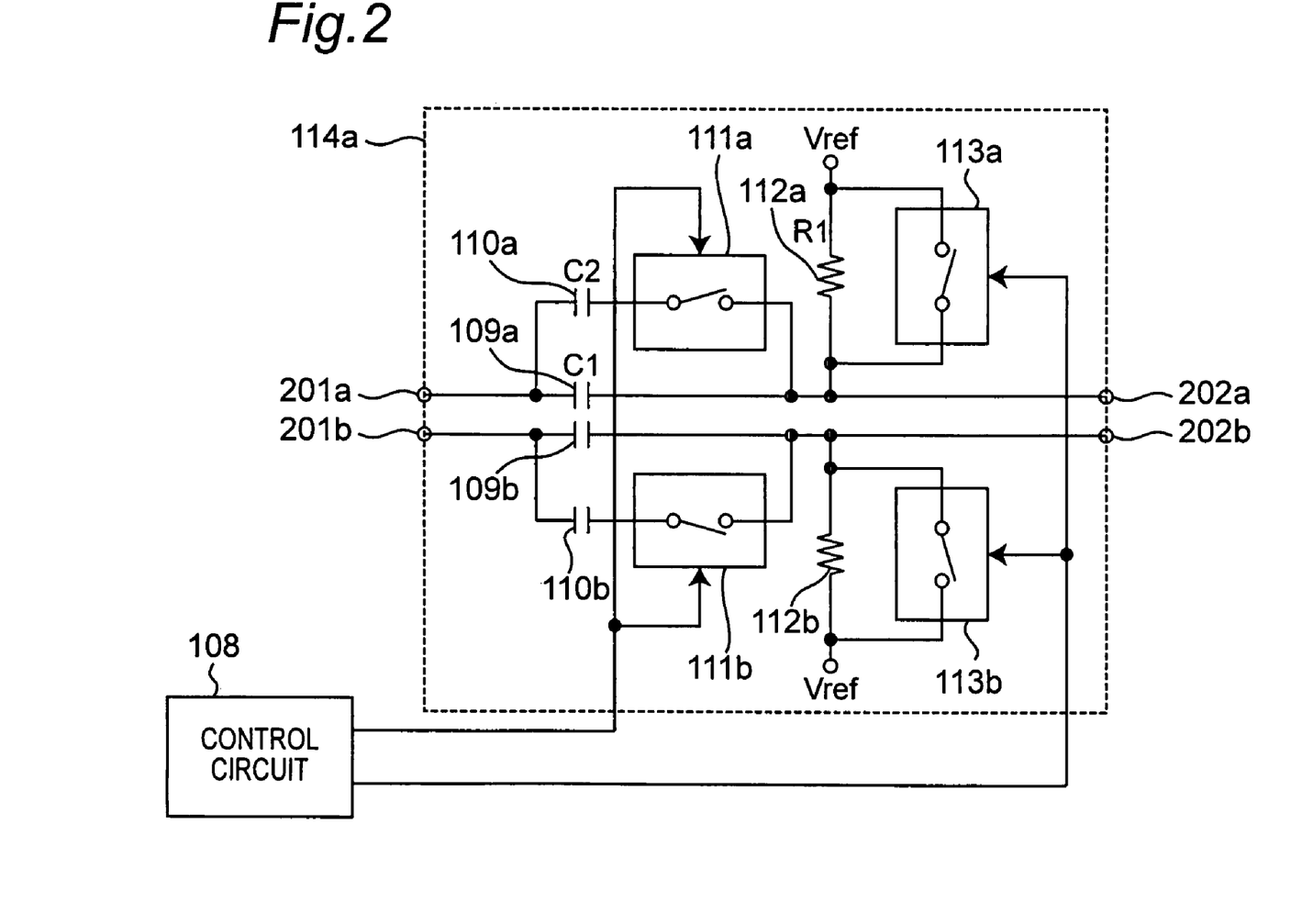
FIG. 2 is a block diagram showing the detailed structure of a high pass filter according to the first embodiment of the present invention.

With reference to FIGS. 1 to 3, a direct conversion receiving apparatus of a first embodiment according to the present invention will be described below. FIG. 1 is a block diagram showing the structure of a direct conversion receiving apparatus according to the first embodiment of the present invention.

The direct conversion receiving apparatus according to the first embodiment of the present invention is configured by coupling in serial three stages each including of a gain control amplifier (GCA) 106a, 106b, or 106c; a low pass filter (LPF) 107a, 107b, or 107c; and a high pass filter (HPF) 114a, 114b, or 114c, respectively. The GCA 106b and 106c are the same structures as the GCA 106a. The LPF 107b and 108c are the same structures as the LPF 107a.

In FIG. 1 of the first embodiment, the same parts as the conventional example of FIG. 7 are provided with the same reference numerals. The direct conversion receiving apparatus according to the first embodiment of the present invention is different from the conventional direct conversion receiving apparatus in that it has high pass filters 114a, 114b, and 114c in place of the high pass filters 119a, 119b, and 119c and the control circuit 108 transmits the first time constant switching control signal to the high pass filters 114a, 114b, and 114c in addition to the second time constant switching control signal as same as the conventional example. The other structures are the same as the conventional direct conversion apparatus.

The high pass filter (HPF) 114a has first capacitors 109a, 109b for cutting the DC, second capacitors 110a and 110b for cutting the DC, first time constant switching circuits 111a and 111b controlled by a first time constant switching control signal transmitted from a control circuit 108, first resistors 112a, 112b, and second time constant switching circuits 113a and 113b controlled by a second time constant switching control signal transmitted from the control circuit 108. The HPF 114a of the first embodiment is configured by adding the second capacitors 110a and 10b and the first time constant switching circuits 111a and 111b to the HPF 119a in the conventional apparatus. The high pass filters (HPF) 114b and 114c have the same structures as the high pass filter (HPF) 114a.

The direct conversion receiving apparatus shown in FIG. 1 will be described below. The RF (radio frequency) signal received via an antenna is input to the input terminal 101 of the IC for the RF through a LNA (a low noise amplifier) and a SAW filter (not illustrated). Then, the RF amplifier 102 amplifies the RF signal input to the input terminal 101 to output it.

A VCO (local oscillator) 103 outputs a local signal of a local oscillation frequency. A 0°/90° phase converter 104 divides the frequency of the local signal by four and outputs it. The local signal having its frequency divided by four has the same frequency as the center frequency of the RF signal input in the input terminal 101.

A mixer 105 inputs the RF signal and the local signal, demodulates them in orthogonal, and generates a base band signal from the RF signal to output it.

A control circuit 108 outputs a gain switching control signal to gain control amplifiers (GCA) 106a, 106b, and 106c, and also outputs a first time constant switching control signal and a second time constant switching control signal to the high pass filters (HPF) 114a, 114b, and 114c.

The gain control amplifier (GCA) 106a inputs the base band signal output from the mixer 105, amplifies the base band signal with the gain determined on the basis of the gain switching control signal output from the control circuit 108, and outputs this signal.

The low pass filter (LPF) 107a inputs the base band signal, cuts off the high band frequency, and outputs this signal.

The high pass filter (HPF) 114a inputs the base band signal output from the LPF 107a, cuts off the low band frequency, and outputs this signal. The details will be described later.

The signal output from the HPF 114a passes through the GCA 106b, the LPF 107b, and the HPF 114b at the second stage, and the GCA 106c, the LPF 107c, and the HPF 114c at the third stage.

Before the base band signal passes through the HPF 114c, the all pass filter (APF) 115 makes the phase of the base band signal output from the LPF 107c flat and outputs it.

The buffer amplifier 116 amplifies the base band signal and outputs it. The output terminal 117 outputs the base band signal.

FIG. 2 is a block diagram showing the detailed structure of the high pass filter 114a of the direct conversion receiving apparatus according to the first embodiment in FIG. 1. In FIG. 2, the first capacitor 109a (109b) for cutting the DC is connected in parallel to a serial connected circuit (a serial circuit) which including the second capacitor 110a (110b) for cutting the DC and the first time constant switching circuit 111a (111b) to form a first parallel connected circuit (a first circuit) The first parallel connected circuit connects the input terminal 201a (201b) of the high pass filter 114a to the output terminal 202a (202b) thereof.

The first resistor 112a (112b) is connected in parallel to the second time constant switching circuit 113a (113b) to form a second parallel connected circuit (a second circuit). The second parallel connected circuit connects the output terminal 202a (202b) of the high pass filter 114a to a reference voltage Vref.

In FIG. 1, the capacitance of the first capacitor 109a (109b) is referred to as C1; the capacitance of the second capacitor 110a (110b) is referred to as C2; the resistance of the first resistor 112a (112b) is referred to as R1; and an output impedance of a reference voltage (Vref) connected to the first resistor 112a (112b) and the second time constant switching circuit 113a (113b) is referred to as Rref.

The capacitance C1 of the first capacitor 109a (109b) is a capacitance value that is not more than $1/100$ of the capacitance C2 of the second capacitor 110a (10b).

During the normal operation, the first time constant switching circuit 111a (111b) is turned on, and the second time constant switching circuit 113a (113b) is turned off. The first capacitor 109a (109b) and the second capacitor 110a (110b) inputs the base band signal to cut the DC offset thereof. During the normal operation, a Lower cutoff frequency of the HPF 114a is set at a value decided by (C1+C2)×(R1+Rref) (for example, 10 kHz).

The first time constant switching circuit 111a (111b) is configured by a switch for switching on/off by a first time constant switching control signal from the control circuit 108. For example, it is a switch circuit for performing the simple on/off operations, such as, a transfer gate.

The second time constant switching circuit 113a (113b) is configured by a switch for switching on/off by a second time constant switching control signal from the control circuit 108.

For example, it is a switch circuit for performing the simple on/off operations, such as, a transfer gate.

FIG. 3 shows a wave form of each part when switching the gain of the gain control amplifiers (GCA) 106a, 106b, and 106c of the direct conversion receiving apparatus according to the first embodiment. The wave form shown in FIG. 3A is an example of the RF input signal input in the input terminal 101. The wave form shown in FIG. 3B shows a gain switching control signal to control the gains of the GCA 106a, 106b, and 106c output from the control circuit 108. The wave form shown in FIG. 3C indicates the second time constant switching control signal to control the second time constant switching circuit 113a (113b) output from the control circuit 108. The wave form shown in FIG. 3D indicates the first time constant switching control signal to control the first time constant switching circuit 111a (111b) output from the control circuit 108. The wave form shown in FIG. 3E indicates a transitional property of the output signal of the HPF 114a. In FIG. 1, the HPF 114a, 114b, and 114c carry out the same operations. In FIG. 2, the upper half (given with a reference mark a) and the lower half (given with a reference mark b) of the HPF 114a carry out the same operations. The operation of the upper half of the HPF 114a in FIG. 2 will be described below.

For a period from input of the RF signal to a time t1, the first time constant switching circuit 111a of the high pass filter 114a is turned on, and the second time constant switching circuit 113a is turned off. The cutoff frequency of the HPF 114a is decided by (C1+C2)×(R1+Rref) to be set at a value about 10 kHz, whereby the wave form of the base band signal is not deteriorated.

Figure 3A:
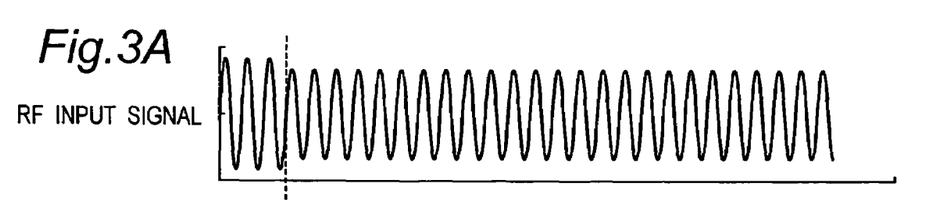
FIG. 3 is a wave form chart showing the operation of each part of the direct conversion receiving apparatus according to first to third embodiments of the present invention.
Figure 3B:
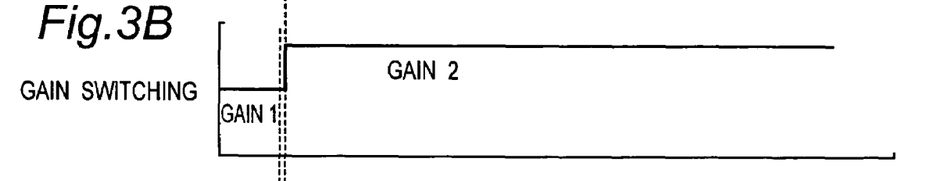

As shown in FIG. 3B, the gain control amplifier (GCA) 106a switches the gain from gain 1 into gain 2 at the time t2 on the basis of the gain switching control signal from the control circuit 108.

According to the present invention, the second time constant switching circuit 113a of the HPF 114a is turned on from off at the time t1 prior to the timing (t2) at which the gain of the GCA 106a is switched from the gain 1 into the gain 2. In other words, the first resistor 112a of the HPF 114a is switched from the normal state into the short-circuit state.

If the second time constant switching circuit 113a is turned on from off at the time t2 in conjunction with the timing of the gain switching of the GCA 106a, due to dispersion of the gain switching timing and the switching timing of the second time constant switching circuit 113a, there is a possibility such that the second time constant switching circuit 113a is turned on from off after the gain switching of the GCA 106a.

In this case, at the time t2, the very long time constant, namely, (C1+C2)×(R1+Rref) is obtained only for a certain period of time, so that the transitional DC offset variation generated when switching the gain cannot be suppressed and this causes deterioration of the signal.

Since the direct conversion receiving apparatus has the structure that plural stages of the amplifiers are connected in series, the DC change of the first stage (GCA 106a, LPF 107a, HPF 114a) is transmitted as gradually amplified toward the rear stage. If the DC change at the first stage is large, at the last stage (GCA 106c, LPF 107c, HPF 114c), the DC change so large that the base band signal component is not output for a while is caused. When the DC change is caused at the first stage, a time required for returning the last stage into the normal state is far longer than a time required for returning the first stage into the normal state. Accordingly, it is important for the direct conversion receiving apparatus to control the DC change at each stage (particularly, the first stage) not to deviate from a predetermined range.

Figure 3C:
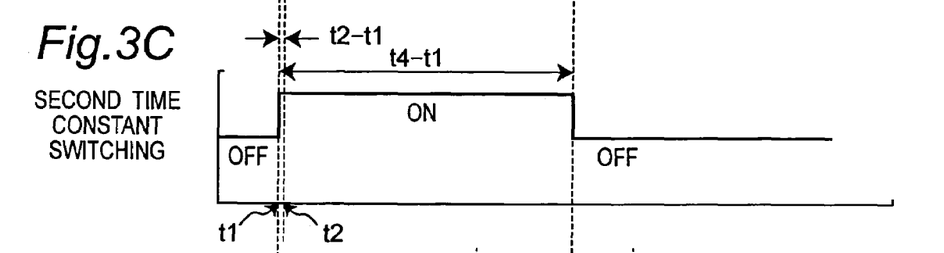

The direct conversion receiving apparatus according to the present embodiment operates so as to solve the above-described defect. As shown in FIG. 3C, the control circuit 108 sets a margin for the dispersion of the switching timing of the second time constant switching circuit 113a by switching the second time constant switching circuit 113a connected to the first resistor 112a in parallel from off into on at the time t1 prior to the time t2. Thereby, for a period of (t1 to t2), the DC change is always stable and it converges at a short time constant that is decided by (C1+C2)×Rref. When switching the gain from gain 1 into gain 2, the transitional DC offset variation is generated. However, the short time constant, namely, (C1+C2)×Rref, can rapidly suppress the transitional DC offset variation. The first capacitor 109a and the second capacitor 110a rapidly converge into the normal state with the GCA 106a set into the gain 2. The effect of the DC change at the first stage on the last stage can be suppressed so that the last stage can output the base band signal. According to the present embodiment, the period of (t1 to t2) is set at about 0.2 µs equivalent to one cycle of a clock of the control circuit 108.

The first time constant switching circuit 111a and the second time constant switching circuit 113a are turned on for a period of (t1 to t3), so that the cutoff frequency of the HPF 114a is decided by (C1+C2)×Rref and for example, it becomes about 1 MHz.

Figure 3D:
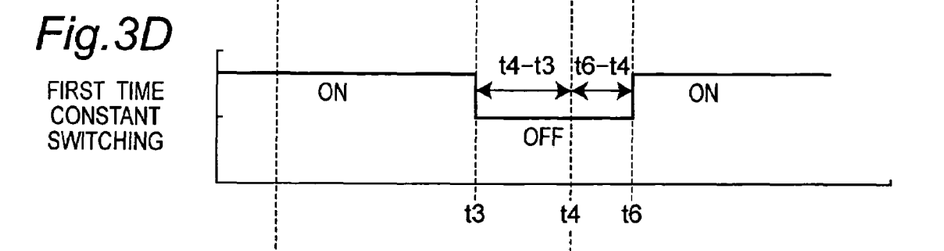
Figure 3E:
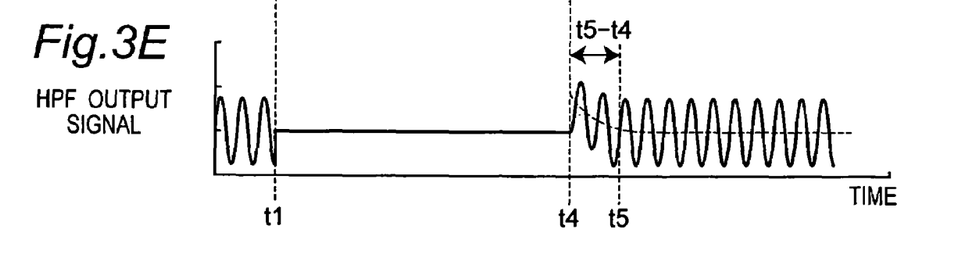

For a period of (t1 to t4) that the second time constant switching circuit 113a is turned on, the output wave form of the HPF 114a is made into the wave form shown in FIG. 3E. In order to suppress the deterioration of the BER at the minimum, this period of (t1 to t4) is preferably short as much as possible. According to the present embodiment, this period is set at about 4 µs.

As shown in FIG. 3D, the first time constant switching circuit 111a is turned off from on at the time t3 prior to the timing (t4) for returning the second time constant switching circuit 113a into off from on. Thereby, the second capacitor 110a is effectively separated from the HPF 114a. Then, at the time t4, the second time constant switching circuit 113a is returned into off from on. In other words, the first resistor 112a of the HPF 114a is returned from the short-circuit state into the normal state.

If the first time constant switching circuit 111a is turned off from on at the time t4 in conjunction with turning the second time constant switching circuit 113a from on into off, there is a possibility that the first time constant switching circuit 111a is turned off after the second time constant switching circuit 113a is turned off due to dispersion of the timing of the first time constant switching circuit 111a and the timing of the second time constant switching circuit 113a.

In this case, unless the phase of the base band signal to be input in the HPF 114a is 0° or 180°, the DC voltage is changed transiently. In other words, unless the phase of the base band signal to be input in the HPF 114a is 0° or 180° at the time t4, the DC potential at the output side of the capacitance (C1+C2) is different from the constant DC potential, and the output signal of the HPF 114a is varied by just much of the potential difference. This variation has a very long time constant, namely, (C1+C2)×(R1+Rref) when the capacitance (C1+C2) of the HPF 114a is not changed. As a result, it is not possible to suppress the transitional DC offset variation generated when turning off the second time constant switching circuit 113a, and this leads to deterioration of the signal.

The direct conversion receiving apparatus according to the present embodiment operates so as to solve the above-described defect. As shown in FIG. 3D, the first time constant switching circuit 111a is switched from on into off at the time t3 prior to the time t4, and thus the margin is set against the dispersion of the switching timing of the first time constant switching circuit 111a. Thereby, in the HPF 114a, for the period of (t3 to t4), the DC change converges at a time constant decided by C1×Rref, and for the period of (t4 to t6) the DC change is always stable and it converges at the short time constant decided by C1×(R1+Rref), respectively. When turning the second time constant switching circuit 113a from on into off, the transitional DC offset variation is caused, however, this short time constant of C1×(R1+Rref) can rapidly suppress the transitional DC offset variation. The first capacitor 109a rapidly converges to a normal state with the second time constant switching circuit 113a turned off. The effect of the DC change at the first stage on the last stage can be suppressed within the range that the last stage can normally output the base band signal. For the period of (t4 to t6), the second capacitor 110a is charged separately to make the stationary DC state with the second time constant switching circuit 113a turned off while the second capacitor 110a is separated from the operation of the HPF 114a.

Setting the capacitance of the C1 to ¹⁄₁₀₀ of the C2 or below can make the transitional DC offset variation for the period of (t4 to t6) to converge in a time of ¹⁄₁₀₀ as compared to the case when the capacitance is not switched. According to the present embodiment, the period of (t3 to t4) is set at 1 µs, the period of (t4 to t6) is set at 1 µs, and the converge time of (t4 to t5) is made not more than lps, respectively.

At the time t6 after the time t4, the first time constant switching control signal is returned from off into on. At the time t6, the potential at the output side of the second capacitor 110a substantially converges to the stationary DC potential. Thus, even if the first time constant switching circuits 111a and 111b are returned from off into on at the time t6, the slight DC offset is merely generated at the output signals of the HPF 114a, 114b, and 114c. Since this DC offset at the first stage is sufficiently small, the effect of the DC change at the first stage on the last stage is suppressed in the range such that the last stage can normally output the base band signal.

In other words, the cutoff frequency of the HPF 114a prior to the time t1 (the time t1 is prior to the time t2 at which the gain is switched) is set at a value decided by (C1+C2)×(R1+Rref) (for example, about 10 kHz); the cutoff frequency of the HPF 114a at the period of (t1 to t3) is set at a value decided by (C1+C2)×(R1+Rref) (for example, about 1 MHz); the cutoff frequency of the HPF 114a at the period of (t3 to t4) is set at a value decided by C1×Rref (for example, about 100 MHz); the cutoff frequency of the HPF 114a at the period of (t4 to t6) is set at a value decided by C1×(R1+Rref) (for example, about 1 MHz); and the cutoff frequency of the HPF 114a at the period on and after t6 is set at a value decided by (C1+C2)×(R1+Rref) (for example, about 10 kHz). Switching the HPF 114a (and the HPF 114b, the HPF 114c) in this way upon switching of the gain of the GCA 106a, 106b, and 106c can suppress the generation of the transitional DC offset variation in the output of the HPF 114a, 114b, and 114c as much as possible. When switching the gain of the GCA, the direct conversion receiving apparatus is rapidly returned into the stationary state and this makes it possible to maintain the low BER.

Second Embodiment

Figure 4:
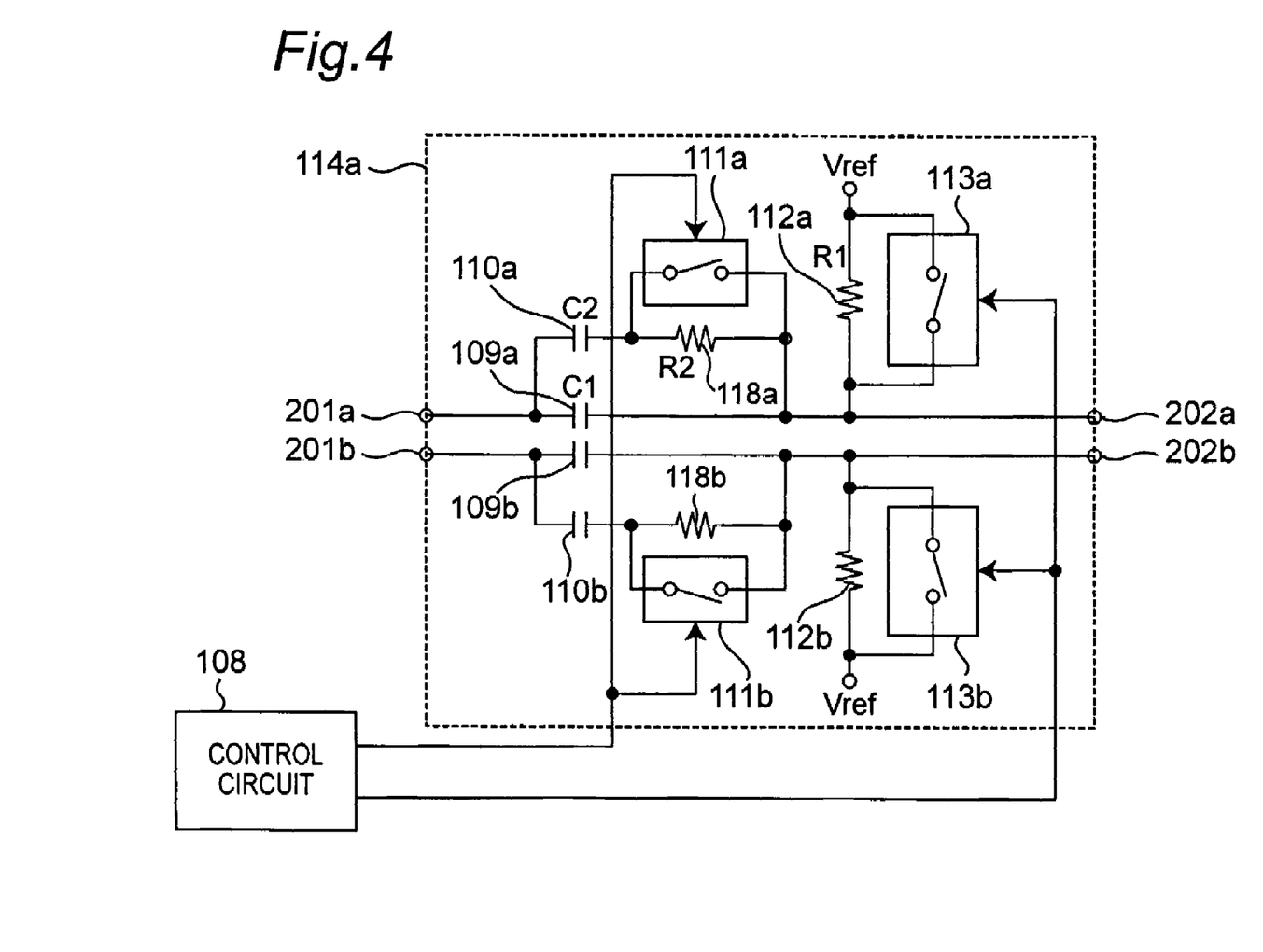
FIG. 4 is a block diagram showing the detailed structure of a high pass filter according to the second embodiment of the present invention.

With reference to FIGS. 1, 3, and 4, the direct conversion receiving apparatus according to the second embodiment will be described below. The direct conversion receiving apparatus according to the second embodiment is different from the apparatus according to the first embodiment in the inner structures of the high pass filter (HPF) 114a, 114b, and 114c.

With respect to other structures, the direct conversion receiving apparatus according to the second embodiment is the same as the apparatus according to the first embodiment. Since FIG. 1 and FIG. 3 are the same as the first embodiment, the detailed explanation thereof is herein omitted. Since the HPF 114*a*, 114*b*, and 114*c* have the same structures, the HPF 114*a* will be described below.

FIG. 4 is a block diagram showing the detailed structure of the high pass filter (HPF) 114*a* according to the second embodiment. The high pass filter (HPF) 114*a* according to the second embodiment has the first capacitors 109*a*, 109*b* for cutting the DC, second capacitors 110*a* and 110*b* for cutting the DC, first time constant switching circuits 111*a* and 111*b* controlled by the control circuit 108, first resistors 112*a*, 112*b*, second time constant switching circuits 113*a* and 113*b* controlled by the control circuit 108, and second resistors 118*a* and 118*b*. The HPF according to the second embodiment is different from the HPF according to the first embodiment in that the HPF according to the second embodiment has the second resistors 118*a* and 118*b* that are connected to the second capacitors 110*a* and 110*b* in series. The first time constant switching circuits 111*a* and 111*b* are connected to the second resistors 110*a* and 110*b* in parallel. In FIG. 4, the upper half of the HPF 114*a* (given with the reference mark a) and the lower half thereof (given with the reference mark b) carries out the same operations. The operation of the upper half of the HPF 114*a* in FIG. 4 will be described below.

In FIG. 4, the first time constant switching circuit 111*a* and the second resistor 118*a* configures a third parallel connected circuit. The first capacitor 109*a* for cutting the DC and a serial connected circuit made of the second capacitor 110*a* for cutting the DC and the third parallel connected circuit configures a first parallel connected circuit (a first circuit), and this first parallel connected circuit connects the input terminal of the high pass filter 114*a* to the output terminal thereof.

The first resistor 112*a* and the second time constant switching circuit 113*a* configures a second parallel connected circuit (a second circuit), and this second parallel connected circuit connects the output terminal of the high pass filter 114*a* to the reference voltage Vref.

In the direct conversion receiving apparatus according to the second embodiment, since the second resistor 118*a* having a certain limited value is connected to the first time constant switching circuit 111*a* in parallel, for the period of (t4 to t6) in FIG. 3, electricity is charged accurately to make the stationary DC state with the second time constant switching circuit 113*a* turned off when the second capacitor 110*a* is separated from the operation of the HPF 114*a*. Thereby, at the time t6, when the first time constant switching signal is returned from off into on, since the potential at the output side of the second capacitor 110*a* substantially converges to the stationary DC potential, even if the first time constant switching circuits 111*a* and 111*b* are returned from off into on at the time t6, the slight DC offset is merely generated at the output signals of the HPF 114*a*, 114*b*, and 114*c*. Since this DC offset at the first stage is sufficiently small, the effect of the DC change at the first stage on the last stage is suppressed in the range such that the last stage can normally output the base band signal.

As shown in FIG. 3D, at the time t3 at which the first time constant switching circuit 111*a* is turned from on into off, the wave form response at the output side of the second capacitor 110*a* has a time constant of C2×(R2+Rref). For example, assuming that C2 is 150 pF, R2 is 5 kΩ, and Rref is about 100 Ω, the time constant becomes 0.77 μs and thereby, it is possible to make the wave form at the output side of the second capacitor 110*a* to converge for a short time.

Also at the time 4 turning the second time constant switching circuit 113*a* from on into off, the transitional DC offset variation upon switching of the time constant converges at the time constant of about C2×(R2+Rref).

At the time t6 turning the first time constant switching circuit 111*a* from off into on, even if the signal is in any phase, there is no effect of the potential change in the output of the HPF 114*a* because the opposite ends of the second capacitor 110*a* have already converged to the same potential.

As described above, connecting the second resistor 118*a* having the certain limited value in parallel with the first time constant switching circuit 111*a* can stably suppress the transitional DC offset variation when controlling the first time constant switching circuit 111*a* and the second time constant switching circuit 113*a*. In the mean time, according to the second embodiment, the value of the second resistor 118*a* is set at 5 kΩ.

Third Embodiment

Figure 5:
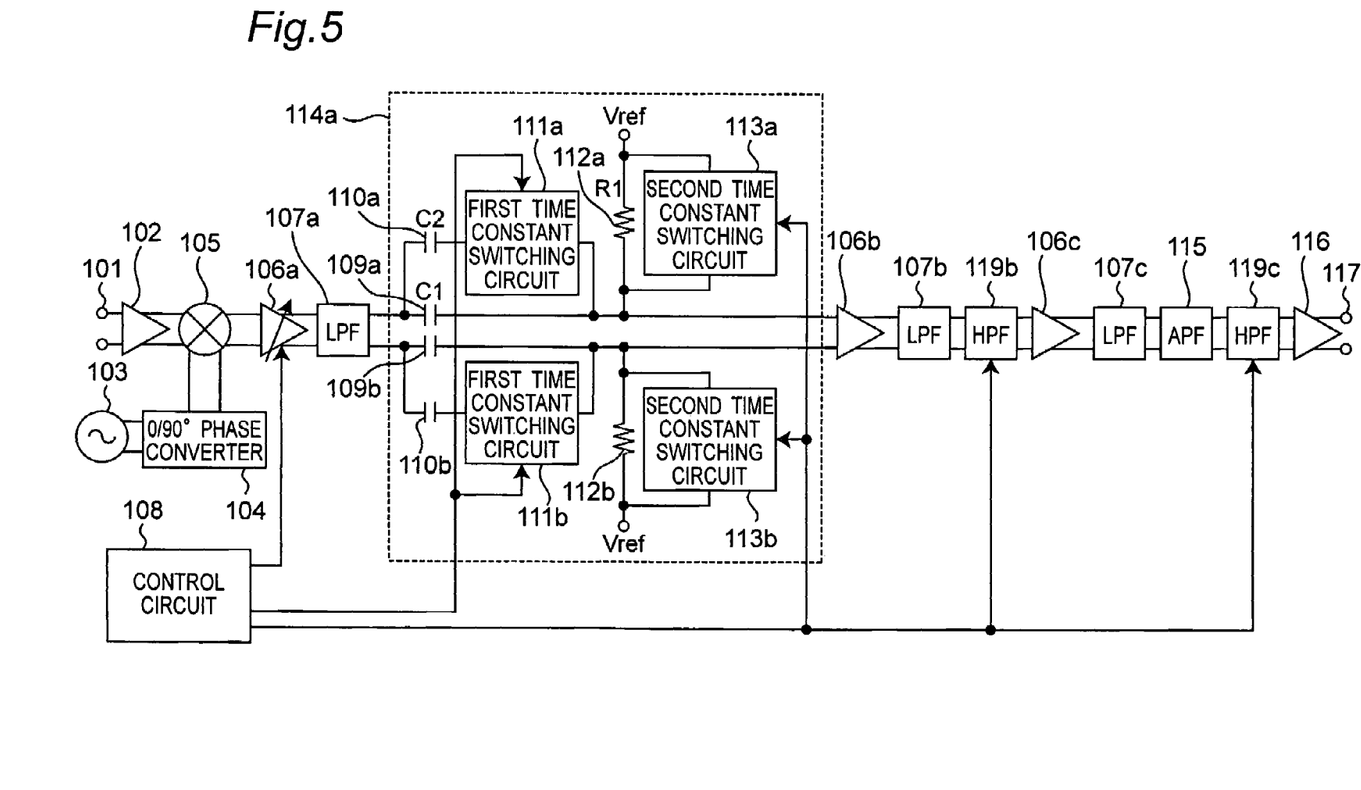
FIG. 5 is a block diagram showing the structure of a direct conversion receiving apparatus according to a third embodiment of the present invention.

With reference to FIGS. 2, 3, and 5, the direct conversion receiving apparatus according to the third embodiment will be described below. Since FIG. 2 and FIG. 3 have been described in the first embodiment, the detailed explanation is herein omitted. FIG. 5 is a block diagram showing the structure of the direct conversion receiving apparatus according to the third embodiment. The direct conversion receiving apparatus according to the third embodiment is different from that according to the first embodiment in that the direct conversion receiving apparatus according to the third embodiment has high pass filters (HPF) 119*b* and 119*c* in place of the high pass filters (HPF) 114*b* and 114*c*. The HPF 114*a* according to the third embodiment has the same structure as that of the HPF 114*a* according to the first embodiment (FIGS. 1 and 2). In place of this, the HPF 114*a* may have the same structure as that of the HPF 114*a* according to the second embodiment (FIG. 4). The HPF 119*b* and the HPF 119*c* according to the third embodiment have the same structures as that of the HPF 119*a* of the conventional example (FIG. 7).

The control circuit 108 outputs a gain switching control signal to a gain control amplifier (GCA) 106*a*; outputs the first and second time constant switching control signals to the high pass filter (HPF) 114*a*; and outputs the second time constant switching control signal to the high pass filters (HPF) 119*b* and 119*c*.

According to the third embodiment, the gain of the GCA 106*a* can be only switched, and the gain of the GCA 106*b* and 106*c* are fixed values. In addition, the gain of the GCA 106*a* is set at a higher value, and as compared to this, the gains of the GCA 106*b* and 106*c* are small.

According to the third embodiment, the output signal of the HPF 114*a* is formed in a wave form as shown in FIG. 3E. At the output signal of the first stage of the HPF 114*a*, the slight DC offset is only generated. It is possible to suppress the effect of the DC change at the first stage on the last stage within the range such that the last stage can output the base band signal normally because this DC offset at the first stage is sufficiently small and the gains of the GCA 106*b* and 106*c* are comparatively small. According to the third embodiment, even if the HPF at the second and third stages are configured is as same as the conventional example, it is possible to normally output the base band signal in the GCA 106*b* and 107*c* at the second and third stages.

According to the direct conversion receiving apparatuses of the first to third embodiments of the present invention, under a normal usage condition inputting the RF signal, when the gain of the gain control amplifier is switched, it is possible to suppress the variation of the voltage of the transitional DC offset in the output signal of the high pass filter for cutting the DC at the rear stage while suppressing the deterioration of the signal as much as possible. The present invention is effective for the wireless direct conversion receiving apparatus such as the cellular phone.

Fourth Embodiment

Figure 6:
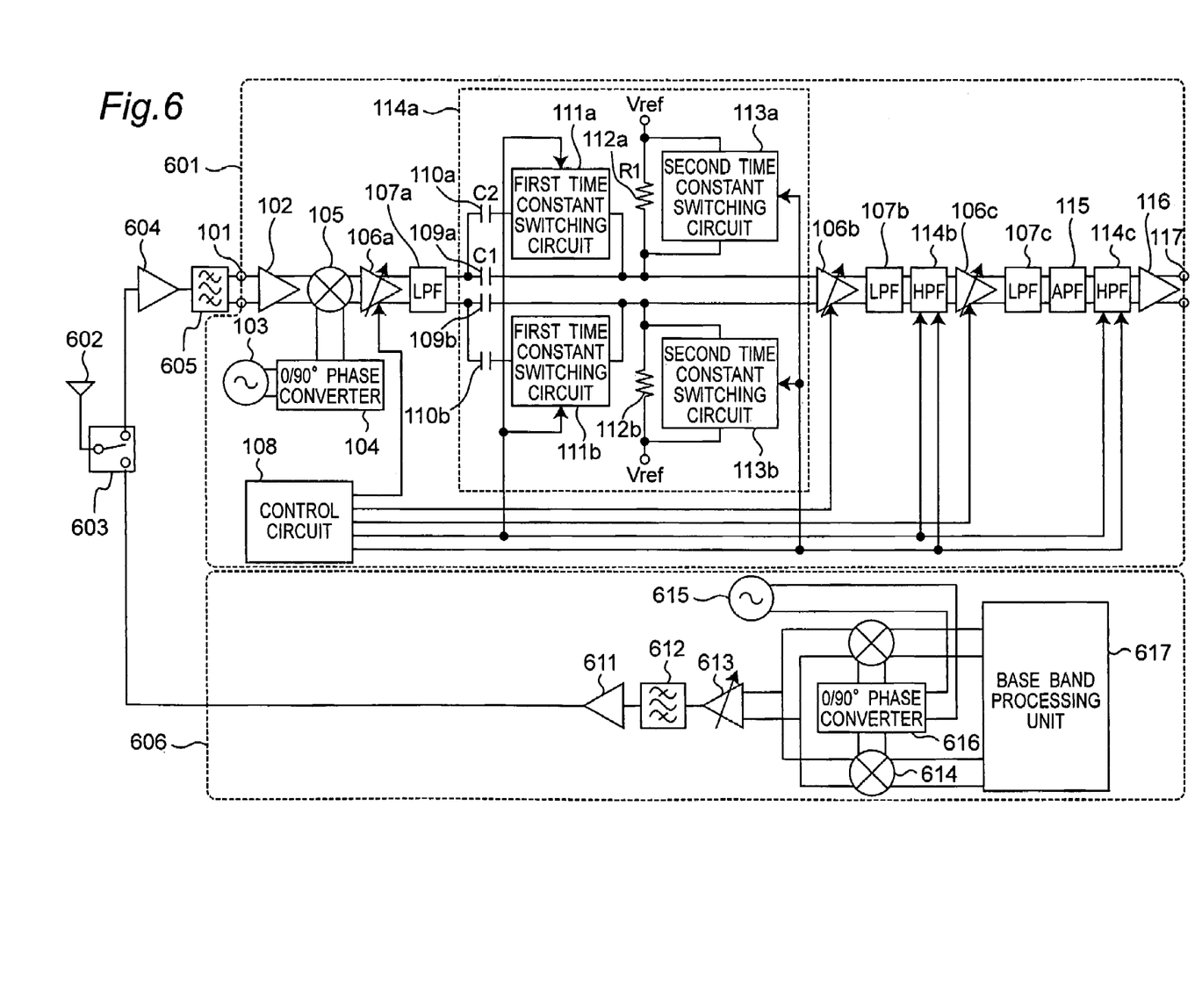
FIG. 6 is a block diagram showing the structure of a cellular phone according to a fourth embodiment of the present invention.

With reference to FIG. 6, the cellular phone according to the fourth embodiment will be described below. FIG. 6 is a block diagram showing the structure of the cellular phone according to the fourth embodiment. In FIG. 6, the same reference numerals are given to the same constituent elements as those shown in FIG. 1.

The cellular phone according to the fourth embodiment of the present invention has a direct conversion receiving apparatus 601; an antenna 602; an antenna switch 603; a low noise amplifier (LNA) 604; a receiving SAW filter 605; and a transmitting apparatus 606.

The direct conversion receiving apparatus 601 has the same structure as the first embodiment (FIG. 1). In place of this, the cellular phone according to the fourth embodiment of the present invention may have the direct conversion receiving apparatus of the second embodiment or the third embodiment.

The antenna 602 receives the RF signal and output a signal that is output from the transmitting apparatus 606.

The antenna switch 603 connects the receiving low noise amplifier (LNA) 604 to one terminal and connects the transmitting apparatus 606 to the other terminal.

The receiving low noise amplifier (LNA) 604 amplifies the RF signal received by the antenna 602 with a low noise and output it. The receiving low noise amplifier (LNA) 604 is connected to the receiving SAW filter 605 in series.

The receiving SAW filter 605 inputs the output signal of the receiving low noise amplifier (LNA) 604, transmits a signal component of a predetermined frequency band, and outputs it to the direct conversion receiving apparatus 601. The direct conversion receiving apparatus 601 inputs the output signal of the receiving SAW filter 605, demodulates it, and outputs the base band signal.

The transmitting apparatus 606 has a transmitting power amplifier 611, a transmitting SAW filter 612, a transmitting gain control amplifier 613, a transmitting mixer 614, a transmitting VCO 615, a transmitting 0°/90° phase converter 616, and a base band processing unit 617.

The base band processing unit 617 outputs the base band signal. The transmitting VCO 615 outputs the local signal. The transmitting 0°/90° phase converter 616 divides the frequency of the local signal into four and outputs it. The transmitting mixer 614 inputs the base band signal and the local signal, modulates the base band signal with the local signal, and fetches the RF signal. The transmitting gain control amplifier 613 amplifies the RF signal. The transmitting SAW filter 612 transmits the RF signal of a predetermined frequency band. The transmitting power amplifier 611 inputs the RF signal transmitted through the transmitting SAW filter 612 and transmits it through the antenna 602.

According to the cellular phone of the fourth embodiment, by using any direct conversion receiving apparatus 601 among the first to third embodiments, it is possible to reduce the deterioration of the quality of the receiving signal and it is possible to suppress the transitional variation of the DC offset voltage at the side of the output terminal of the capacitor for cutting the DC of the high pass filter.

The present invention is effective for the wireless direct conversion receiving apparatus and the cellular phone or the like.

The above-described disclosure of the invention in terms of the presently preferred examples is not to be interpreted as intended for limiting. Various alterations and modifications will no doubt become apparent to those skilled in the art to which the invention pertains, after having read the disclosure. As a corollary to that, such alterations and modifications apparently fall within the true spirit and scope of the invention. Furthermore, it is to be understood that the appended claims be intended as covering the alterations and modifications. The present disclosure relates to subject matter contained in Japanese Patent Application No. 2004-198611, filed on Jul. 5, 2004, which is expressly incorporated herein by reference in its entirety.

What is claimed is:

1. A direct conversion receiving apparatus, comprising:
   a gain control amplifier for input a base band signal and a gain switching control signal to control a gain, and variably amplify the base band signal based on the gain switching control signal;
   a high pass filter having an input terminal for input the output signal of said gain control amplifier, an output terminal, a first circuit including plural capacitors connected in parallel that are inserted in a path connecting the input terminal to the output terminal and switching effective total capacitance of the plural capacitors based on a first time constant switching control signal, and a second circuit including a resistor for providing a predetermined direct current voltage to the output terminal and switching the effective resistance value of the resistor based on a second time constant switching control signal; and
   a control circuit for output the gain switching control signal, and the first and second time constant switching control signals to control the cutoff frequency of said high pass filter according to the change of the gain control of said gain control amplifier,
   wherein,
   during the normal operation, said control circuit sets the capacitance values of the first circuit at a first capacitance value based on the first time constant switching control signal, and sets a resistance value of the second circuit at a first resistance value based on the second time constant switching control signal; and
   on switching the gain of said gain control amplifier, said control circuit switches the capacitance values of the first circuit to a second capacitance value that is smaller than the first capacitance value at a third timing after a second timing at which the gain of said gain control amplifier is switched, and returns the resistance value of the second circuit to the first resistance value at a fourth timing after the third timing.

2. The direct conversion receiving apparatus according to claim 1, wherein said control circuit returns the capacitance values of the first circuit to the first capacitance value at a fifth timing after the fourth timing.

3. A direct conversion receiving apparatus, comprising:
   a gain control amplifier for input a base band signal and a gain switching control signal to control a gain, and variably amplify the base band signal based on the gain switching control signal;
   a high pass filter having an input terminal for input the output signal of said gain control amplifier, an output terminal, a first circuit including plural capacitors connected in parallel that are inserted in a path connecting the input terminal to the output terminal and switching effective total capacitance of the plural capacitors based on a first time constant switching control signal, and a second circuit including a resistor for providing a predetermined direct current voltage to the output terminal and switching the effective resistance value of the resistor based on a second time constant switching control signal; and
   a control circuit for output the gain switching control signal, and the first and second time constant switching control signals to control the cutoff frequency of said high pass filter according to the change of the gain control of said gain control amplifier, wherein the first circuit includes a first capacitor connecting the input terminal to the output terminal, and a serial circuit connected to the first capacitor in parallel and made of a second capacitor and a first time constant switching circuit connected to the second capacitor in series, said first time constant switching circuit being turned on/off on the basis of the first time constant switching control signal and connecting the second capacitor to the first capacitor in parallel when turned on; and the second circuit includes a first resistor providing a predetermined direct current voltage to the output terminal, and a second time constant switching circuit connected to the first resistor in parallel, said second time constant switching circuit being turned on/off on the basis of the second time constant switching control signal and causing a short-circuit in the first resistor when turned on.

4. The direct conversion receiving apparatus according to claim 3, wherein a value of the first capacitance is not more than 1/100 of a value of the second capacitance.

5. The direct conversion receiving apparatus according to claim 3, wherein during the normal operation, said control circuit turns off the second time constant switching circuit; and on switching the gain of the gain control amplifier, said control circuit turns on the second time constant switching circuit at a first timing prior to a second timing at which the gain of said gain control amplifier is switched.

6. The direct conversion receiving apparatus according to claim 3, wherein during the normal operation, said control circuit turns on the first time constant switching circuit and turns off the second time constant switching circuit; and on switching the gain of the gain control amplifier, said control circuit turns off the first time constant switching circuit at a third timing after the second timing at which the gain of said gain control amplifier is switched, and turns off the second time constant switching circuit at a fourth timing after the third timing.

7. The direct conversion receiving apparatus according to claim 6, wherein said control circuit turns on the first time constant switching circuit at a fifth timing after the fourth timing.

8. The direct conversion receiving apparatus according to any of claims 3, wherein two or more stages connected in series are provided, and each stage includes said gain control amplifier and said high pass filter connected at the output side of said gain control amplifier.

9. The direct conversion receiving apparatus according to claim 8, wherein the first circuit of said high pass filter in each stage is connected to said control circuit by a common control line; and the second circuit of said high pass filter in each stage is connected to said control circuit by a common control line.

10. A cellular phone, comprising:

an antenna for receiving or transmitting a radio frequency signal;

a transmitting apparatus that generates a signal which is to be transmitted through the antenna; and the direct conversion receiving apparatus according to claim 3, that receives the radio frequency signal through the antenna to generate a base band signal.

11. A direct conversion receiving apparatus, comprising:

a gain control amplifier for input a base band signal and a gain switching control signal to control a gain, and variably amplify the base band signal based on the gain switching control signal;

a high pass filter having an input terminal for input the output signal of said gain control amplifier, an output terminal, a first circuit including plural capacitors connected in parallel that are inserted in a path connecting the input terminal to the output terminal and switching effective total capacitance of the plural capacitors based on a first time constant switching control signal, and a second circuit including a resistor for providing a predetermined direct current voltage to the output terminal and switching the effective resistance value of the resistor based on a second time constant switching control signal; and a control circuit for output the gain switching control signal, and the first and second time constant switching control signals to control the cutoff frequency of said high pass filter according to the change of the gain control of said gain control amplifier, wherein the first circuit includes a first capacitor connecting the input terminal to the output terminal, a serial circuit connected to the first capacitor in parallel and made of a second capacitor and a second resistance, and a first time constant switching circuit connected to the second resistor in parallel, said first time constant switching circuit being turned on/off on the basis of the first time constant switching control signal and causing a short circuit in the second resistor when turned on; and the second circuit includes a first resistor providing a predetermined direct current voltage to the output terminal and a second time constant switching circuit connected to the first resistor in parallel, said second time constant switching circuit being turned on/off on the basis of the second time constant switching control signal and causing a short circuit in the first resistor when turned on.

12. The direct conversion receiving apparatus according to claim 11, wherein a value of the first capacitance is not more than 1/100 of a value of the second capacitance.

13. The direct conversion receiving apparatus according to claim 11, wherein during the normal operation, said control circuit turns off the second time constant switching circuit; and on switching the gain of the gain control amplifier, said control circuit turns on the second time constant switching circuit at a first timing prior to a second timing at which the gain of said gain control amplifier is switched.

14. The direct conversion receiving apparatus according to claim 11, wherein during the normal operation, said control circuit turns on the first time constant switching circuit and turns off the second time constant switching circuit; and on switching the gain of the gain control amplifier, said control circuit turns off the first time constant switching circuit at a third timing after the second timing at which the gain of said gain control amplifier is switched, and turns off the second time constant switching circuit at a fourth timing after the third timing.

15. The direct conversion receiving apparatus according to claim 14, wherein said control circuit turns on the first time constant switching circuit at a fifth timing after the fourth timing.

* * * * *